United States Patent
Ota et al.

(10) Patent No.: US 6,442,184 B1
(45) Date of Patent: Aug. 27, 2002

(54) NITRIDE-BASED SEMICONDUCTOR LIGHT EMITTING DEVICE AND MANUFACTURING METHOD THEREFOR

(75) Inventors: Hiroyuki Ota; Atsushi Watanabe; Toshiyuki Tanaka, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/459,471

(22) Filed: Dec. 13, 1999

(30) Foreign Application Priority Data

Dec. 14, 1998 (JP) .......................................... 10-354318

(51) Int. Cl.⁷ ................................................ H01S 5/00
(52) U.S. Cl. ............................. 372/43; 372/44; 372/45
(58) Field of Search ..................................... 372/43–45

(56) References Cited

U.S. PATENT DOCUMENTS 5,903,017 A * 5/1999 Itaya et al. .................. 257/190
6,025,252 A * 2/2000 Shindo et al. ............... 438/509

FOREIGN PATENT DOCUMENTS

JP         56080183  A  *  7/1981  .................. 438/34

OTHER PUBLICATIONS

Kitamura et al., "Fabrication of GaN Hexagonal Pyramids on Dot–Patterned GaN/Sapphire Substrates via Selective Metalorganic Vapor Phase Epitaxy", Jpn. J. Appl. Phys., vol. 34 (1995), pp. 1184–1186.*

* cited by examiner

Primary Examiner—Paul Ip
Assistant Examiner—James Menefee
(74) Attorney, Agent, or Firm—Finnegan, Henderson, Farabow, Garrett & Dunner, LLP

(57) ABSTRACT

A semiconductor light emitting device having multi-layer structure of group-3 nitride-based semiconductors is disclosed. The light emitting device has lower density of threading dislocation extending from a boundary of a crystal substrate through the multi-layer structure, thereby obtaining good luminescence characteristics. The nitride semiconductor light emitting device has the multi-layer structure. The multi-layer structure comprises a first crystal layer containing substantially pyramidal crystal grains, each of grains has a crystal face non-parallel to a surface of the substrate, and the pyramidal crystal grains are distributed at random like islands. The structure further comprises a second crystal layer formed on the first crystal layer with a compound having a different lattice constant from that of the first crystal layer. The second crystal layer smoothes a surface of the first crystal layer parallel to the surface of the substrate.

6 Claims, 3 Drawing Sheets

NITRIDE-BASED SEMICONDUCTOR LIGHT EMITTING DEVICE AND MANUFACTURING METHOD THEREFOR

BACKGROUND OF THE INVENTION

1. Field of the Invention

This invention relates to a group-3 nitride-based semiconductor light emitting device, in particular to a single-crystal layer used for the light emitting device and a method for manufacturing the light emitting device.

2. Description of the Related Art

Extensive research is now underway on gallium nitride (abbreviated as GaN hereinbelow) and related compounds as a material system for shortwave light emitting device, in particular shortwave semiconductor lasers. A GaN semiconductor laser device is manufactured by successively depositing semiconductor single-crystal layers such as $(Al_xGa_{1-x})_{1-y}In_yN$ ($0 \leq x \leq 1$, $0 \leq y \leq 1$) on a crystal substrate. Metal organic chemical vapor deposition method (abbreviated as MOCVD hereinbelow) is generally used to produce such a single-crystal layer. In this method, source gases containing trimethyl gallium (abbreviated as TMG hereinbelow) as a group-3 precursor material and ammonia ($NH_3$) as a group-5 precursor material are introduced into a reactor to react at a temperature within the range of 900–1000° C., thereby depositing compound crystals on the substrate. A multi-layer structure comprising various compounds can be obtained by changing the ratio of the precursors fed into the reactor to deposit many different layers on the substrate.

If the deposited single-crystal layers have many penetrating defects, the light emitting performance of the device is deteriorated substantially. Such defect is called threading dislocation, which is linearly extending defect that penetrates the crystal layer along the growth direction. Since a threading dislocation acts as a non-radiative recombination center for carriers, a semiconductor light emitting device comprising a layer with many dislocations suffers from poor luminous efficiency. The above mentioned defect is generated due to crystal misfit strain at an interface between the substrate and an overlying layer formed thereon. To reduce the influence of the misfit at the interface, attempts are made at choosing substrate materials having similar crystal structure, lattice constant, and thermal expansion coefficient to those of GaN-based crystal.

Bulk GaN crystal obviously satisfies the above requirements, however, growing single-crystal GaN with sufficient size is difficult. In addition, a conventional substrate material like GaAs is unstable under the growth temperature in MOCVD described above. Thus, sapphire is commonly used as a substrate for MOCVD growth of nitride semiconductors. Though sapphire has a substantially different lattice constant from that of GaN by about 14%, sapphire provides good stability at higher temperatures.

One approach, known as two-step-growth method, was proposed to accommodate the misfit at the interface between a sapphire substrate and a Ga-based single-crystal layer grown thereon. By using this method, a buffer layer consisting of aluminum nitride (AlN) is formed on the sapphire substrate at a lower temperature within the range of 400–600° C., a GaN single-crystal layer is then formed over the low-temperature buffer layer. However, the above method has not been completely successful in reducing the generation of such defects that pass through the GaN single-crystal layer.

A main object of the invention is to provide a nitride semiconductor light emitting device having good luminescent characteristics.

Another object of the invention is to provide a method for manufacturing the above nitride semiconductor light emitting device whereby the generation of defects passing through a single-crystal layer formed on a substrate can be reduced.

SUMMARY OF THE INVENTION

The present invention features a nitride semiconductor light emitting device having multi-layer structure provided by depositing a group-3 nitride semiconductor on a flat substrate. The multi-layer structure comprises a first crystal layer containing substantially pyramidal crystal grains, each of which having a crystal face non-parallel to a surface of the substrate, the grains being distributed at random like islands; and a second crystal layer formed on said first crystal layer from a compound having a lattice constant different from that of the first crystal layer, the second crystal layer for transferring the surface of said first crystal into a flat surface parallel to the surface of the substrate.

The present invention further features a method for manufacturing a nitride semiconductor light emitting device having multi-layer structure, which is provided by successively depositing group-3 nitride semiconductor layers ($Al_xGa_{1-x})_{1-y}In_yN$ ($0 \leq x \leq 1$, $0 \leq y \leq 1$) on a flat substrate in turn. The method comprises the steps of: forming a first layer containing pyramidal nitride crystal grains being distributed at random like islands, each of the pyramidal grains has a face non-parallel to a surface of the substrate, and forming a second crystal layer over said first layer with a surface of said second layer being parallel to a surface of the substrate, said second crystal layer having a different lattice constant from that of said nitride crystal grains.

Thus, the nitride semiconductor light emitting device of the present invention has lower density of threading dislocations passing through the multi-layer structure. Accordingly, the present invention can provide a nitride semiconductor light emitting device having superior luminescent characteristics.

BRIEF DESCRIPTION OF THE DRAWINGS

The aforementioned aspects and other features of the invention are explained in the following description, taken in connection with the accompanying drawing figures wherein.

DESCRIPTION OF THE PREFERRED EMBODIMENT

Figure 1:
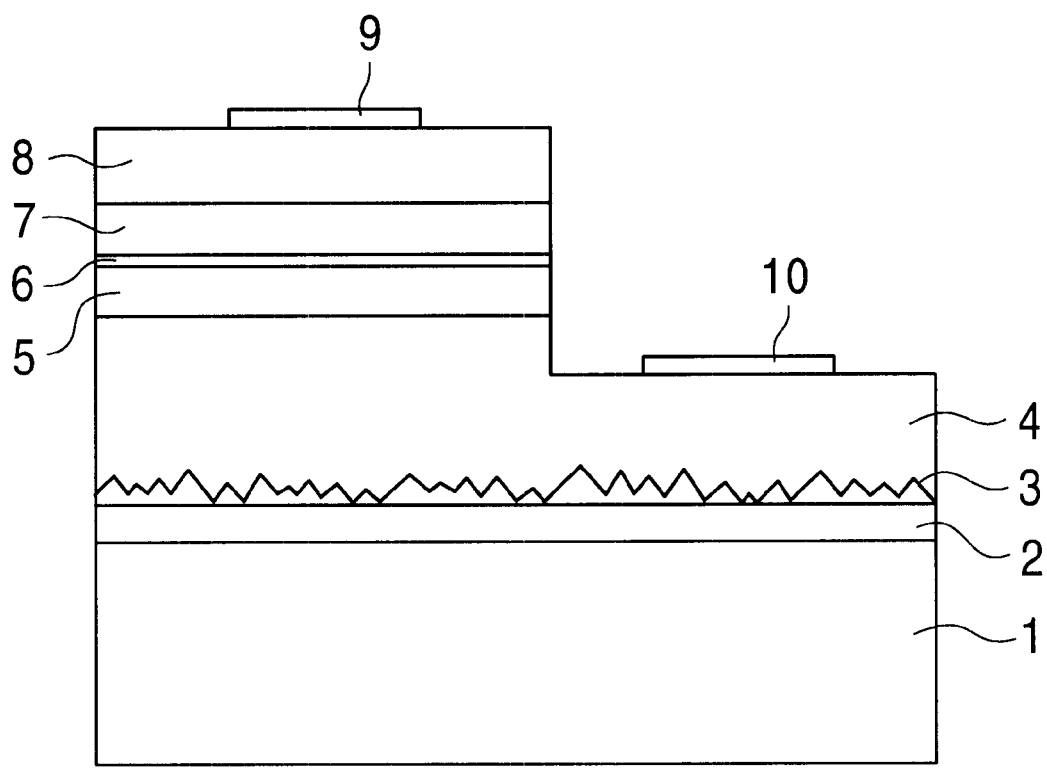
FIG. 1 is a section showing one embodiment of a structure of a group-3 nitride semiconductor light emitting device according to the present invention.

Referring to FIG. 1, a nitride semiconductor light emitting device according to the present invention comprises multi-layer structure formed on a sapphire substrate 1 by depositing single-crystal nitride semiconductor layers represented as $(Al_xGa_{1-x})_{1-y}In_yN$ ($0 \leq x \leq 1$, $0 \leq y \leq 1$). A low-temperature buffer layer 2 of AlN or GaN is formed parallel on a flat surface of the sapphire substrate 1. A first crystal layer 3 is formed on the low-temperature buffer layer 2. The first crystal layer 3 consists of pyramidal crystal grains with faces non-parallel to the substrate 1 and distributed at random like islands on the buffer layer 2. In addition, a second crystal layer 4 of a semiconductor crystal having a lattice constant different from that of the first crystal layer 3 is formed on the crystal layer 3. The first crystal layer 3 is undoped gallium nitride. The second crystal layer is n-type gallium nitride. The second crystal layer 4 smoothes a rough surface of the first crystal layer 3 to restore a flat surface parallel to the surface of the substrate 1. In addition, an n-type cladding layer 5, an active layer 6, a p-type cladding layer 7, and a p-type contact layer a are formed on the second crystal layer 4. A p-type electrode 9 and an n-type electrode 10 are formed on the p-type contact layer 8 and the second crystal layer 4, respectively. The above structure configures the semiconductor light emitting device.

The following will be described for the detail of a method for manufacturing a nitride semiconductor light emitting device according to the present invention.

The sapphire substrate 1 is loaded into a MOCVD reactor, and then placed in a hydrogen atmosphere at a pressure of 300 Torr at a temperature of 1050° C. for ten minutes to heat-clean the surface of the substrate. The sapphire substrate 1 is then cooled to a temperature of 400° C. Next, trimethyl aluminum (abbreviated as TMA hereinbelow) and ammonia $NH_3$ as precursor materials are introduced to the reactor to deposit AlN layer, thereby forming the low-temperature buffer layer 2 having a thickness of 50 nm.

Next, after stopping the feed of TMA, the sapphire substrate 1 with the low-temperature buffer layer 2 is again heated up to 1050° C. while the only $NH_3$ gas is flowing through the reactor (designated as a buffer layer forming step). TMG is then introduced to the reactor at this temperature to deposit the first crystal layer 3, i.e., an undoped GaN underlying layer with a thickness of 1 $\mu$m as a nominal value assuming a uniform growth. The growth of the first crystal layer 3 starts with generation and growth of island-like nuclei. Through coalescence of these islands, it would proceed to two-dimensional growth mate with a flat surface parallel to the substrate. The generation and growth of the crystal nuclei is so-called three-dimensional growth, which is a crystal growth mode as observed in the initial stage of a heteroepitaxy such as GaN growth on a sapphire substrate. The first crystal layer is obtained by interrupting the growth before the transition to the two-dimensional crystal growth. The three-dimensional crystal growth can also be promoted by adsorption of substance different from the material to be grown on the underlying surface of the nitride layer.

Next, methyl silane gas (abbreviated as Me—$SiH_3$ hereinbelow) as an n-type dopant is introduced into the reactor to deposit n-type GaN layer, thereby forming the second crystal layer having a thickness of 4 $\mu$m. During the deposition process of the second crystal layer 4, the feed rate of Me—$SiH_3$ is controlled so that the resultant concentration of a n-type carrier can be equal to or more than $2\times10^{18}$ (1/cc) (designated as a second step).

After forming the n-type GaN layer 4, the feed of TMG and Me—$SiH_3$ is stopped, and cooling the substrate starts. When the temperature of the substrate reaches no more than 400° C., the feed of $NH_3$ is also stopped. When the temperature of the substrate reaches a room temperature, the substrate is unloaded from the reactor.

The resultant wafer of the present invention provided by the process described above is designated as sample-A.

A reference sample was prepared by depositing a first crystal layer 3 by means of the first step without using the second step. This first crystal layer 3 had a nominal thickness of 5 $\mu$m. The resultant sample is designated as reference sample-B.

Another sample was formed by depositing a second crystal layer 4 by means of the second step without using the first step. This second crystal layer 4 had a thickness of 5 $\mu$m. The further resultant sample is designated as reference sample-C.

Photo-luminescence measurement was performed on the samples-A, B, and C to examine the luminescent properties of the samples. It should be noted that the measurements was made by using a nitrogen laser as an excitation light source under strong excitation condition so as to avoid the influence of the difference in the carrier concentration on between undoped sample and n-type-doped sample. However, the excitation intensity of the laser was restrained within the range which does not cause stimulated emission in any sample. As a result, relative light intensities of the samples-B and C to that of the sample-A were 0.22 and 0.43, respectively. The sample-A of the present invention had the best light emitting intensity among three samples.

Next, surfaces of the samples-A, B, and C were photo-electrochemically etched. Proper conditions of the etching enabled the detailed observation of threading dislocations in the layers. The threading dislocation density in the respective samples-A, B, and C measured with a scanning electron microscope were $2\times10^8$, $5\times10^9$, $2\times10^9$ (1/cm$^2$). It is evident that the threading dislocation density in the sample-A of the present invention is lower than those of the samples B and C.

Figure 2:
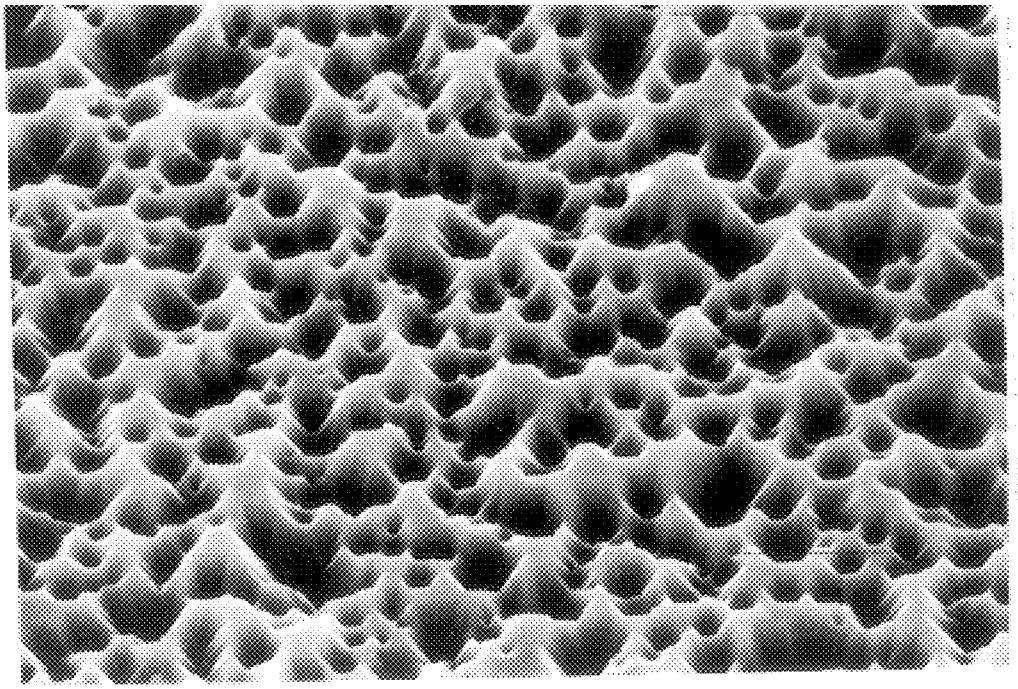
FIG. 2 is a microscopic photograph showing a surface of a first crystal layer constituting the group-3 nitride semiconductor light emitting device according to the present invention.

In addition, another sample-A was prepared by suspending the growth at the end of the first step and unloading the wafer from the reactor. When a surface of the sample-A' was observed by the scanning electron microscope, it was revealed that many pyramidal shaped crystal were distributed like irregular islands, covering the surface of the sample-A' (See FIG. 2).

Figure 3:
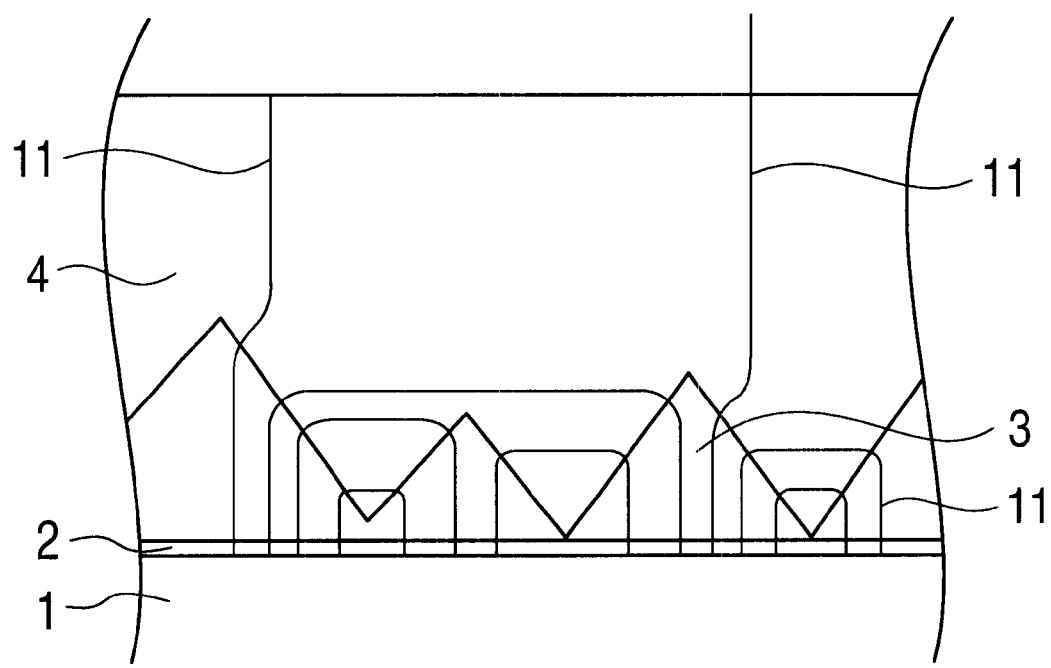
FIG. 3 is an enlarged schematic section showing a reduction mechanism of threading dislocations in the group-3 nitride semiconductor light emitting device according to the present invention.

As shown in FIG. 3, the dislocations 11 generated in the vicinity of the buffer layer 2 on the substrate 1 propagated through the first crystal layer 3 along the direction normal to the substrate 1. However, the dislocations 11 bent their direction of propagation at the boundaries between the first crystal layer 3 and the second crystal layer. This is because the boundaries were angled with respect to the surface of the substrate 1, and because the lattice constant was changed across the boundary due to the higher concentration of silicon doping. Since the boundaries are three dimensional and extend irregularly, the dislocations tend to annihilate by meeting other dislocations, or to be fixed by intertwining with other dislocations within the second crystal layer 4. This leads to the reduction in the density of threading dislocations propagating from the buffer layer to the surface of the second crystal layer 4. Similar advantage can be obtained if the impurity added to the second crystal layer is of an acceptor type. Similar advantage can be also obtained by changing the value of "x" in $Al_xGa_{1-x}N$ in the first crystal layer 3 and the second crystal layer 4.

The reference sample-B once exposed to the atmosphere was again loaded into the MOCVD reactor. The sample-B was then heated to the temperature of 1050° C. in the flow of hydrogen and ammonia gases. TMG was then introduced into the reactor to deposit a GaN layer over the sample-B up to 0.2 $\mu$m. Subsequently, an AlGaN layer having a thickness of 0.5 $\mu$m was formed by introducing TMA in addition to the above gases. The AlN mole fraction in the AlGaN layer was set to be 0.07 by controlling the TMA flow rate.

Additionally, another GaN layer having a thickness of 0.1 μm was formed on the AlGaN layer without feeding TMA. It should be noted that this GaN layer was provided for a photo-luminescence measurement. The feed of TMG was then stopped and the cooling process starts. When the substrate was cooled equally to or less than 400° C., the feed of ammonia gas was stopped. Next, when the temperature of the substrate reached room temperature, the sample was unloaded from the reactor. The resultant sample is designated as sample-B'. The result of photo-luminescence measurement on the sample-B' shows that a relative light intensity of the sample-B' with reference to the sample-A was 0.9. This is because that the surface of the GaN layer is oxygen-contaminated by exposing the GaN layer to the atmosphere. Such contamination lowers the density of nuclei generated on the surface, leading to the three dimensional growth with pyramidal grains. In another embodiment, the surface of an underlying crystal layer was brought into contact with a impurity gas in the reactor to contaminate its surface instead of exposing the surface to the atmosphere. It is also confirmed that this another embodiment has similar advantage to that of the above embodiment.

What is claimed is:

1. A nitride semiconductor light emitting device having multi-layer structure provided by depositing a group-3 nitride semiconductor on a flat substrate, said multi-layer structure comprising:

a first crystal layer containing pyramidal crystal grains, each of said crystal grains having a crystal face non-parallel to a surface of said substrate, said pyramidal crystal grains being distributed at random like islands; and a second crystal layer formed on said first crystal layer from a compound having a different lattice constant from that of said first crystal layer, said second crystal layer for smoothing a surface of said first crystal layer parallel to said surface of said substrate.

2. A nitride semiconductor light emitting device as set forth in claim 1, wherein said substrate is made of sapphire.

3. A nitride semiconductor light emitting device as set forth in claim 1, wherein said crystal layers are made from gallium nitride.

4. A method for manufacturing a nitride semiconductor light emitting device having multi-layer structure, said multi-layer structure being provided by successively depositing group-3 nitride semiconductor layers $(Al_xGa_{1-x})_{1-y}In_yN$ ($0 \leq x \leq 1$, $0 \leq y \leq 1$) on a flat substrate, said method comprising the steps of:

forming a first layer containing pyramidal nitride crystal grains, said pyramidal nitride crystal grains being distributed at random like islands, each of said pyramidal nitride crystal grains having a face non-parallel to a surface of the substrate, and forming a second crystal layer over said first layer with a surface of said second layer being parallel to a surface of said substrate, said second crystal layer having a different lattice constant from that of said nitride crystal grains.

5. A method as set forth in claim 4, further comprising the step of adsorbing another material onto an underlying layer of said first crystal layer prior to said step of forming the first layer, said another material being different from the nitride constituting said first crystal layer.

6. A method as set forth in claim 5, said step of adsorbing another material includes a step of exposing said substrate to the atmosphere.

* * * * *